United States Patent [19]

Ono et al.

[11] 4,017,881
[45] Apr. 12, 1977

[54] LIGHT EMITTING SEMICONDUCTOR DEVICE AND A METHOD FOR MAKING THE SAME

[75] Inventors: Yuichi Ono, Honde; Kazuhiro Kurata, Hachioji; Masao Kawamura, Fuchu; Makoto Morioka, Honde; Kazuhiro Ito, Hinode, all of Japan

[73] Assignee: Hitachi, Ltd., Japan

[22] Filed: Sept. 11, 1975

[21] Appl. No.: 612,282

[30] Foreign Application Priority Data

Sept. 20, 1974 Japan .................... 49-107824

[52] U.S. Cl. .................... 357/18; 357/17; 357/16; 357/20
[51] Int. Cl.² .................... H01S 33/19
[58] Field of Search .................... 375/17, 18, 16, 20

[56] References Cited

UNITED STATES PATENTS

| | | | |
|---|---|---|---|
| 3,636,416 | 1/1972 | Umeda | 317/234 R |
| 3,783,351 | 1/1974 | Tskuda | 317/235 R |
| 3,813,587 | 5/1974 | Umeda | 317/235 N |
| 3,852,798 | 12/1974 | Leabailly | 357/19 |
| 3,855,607 | 12/1974 | Kressel | 357/18 |
| 3,912,556 | 10/1975 | Grenon | 148/175 |
| 3,936,855 | 2/1976 | Goell | 357/17 |

OTHER PUBLICATIONS

Potemski, *I.B.M. Tech. Discl. Bull.*, vol. 15, No. 1, June, 1972, p. 147.
Chang, *I.B.M. Tech. Discl. Bull.*, vol. 15, No. 1, June, 1972, p. 180.

*Primary Examiner*—Martin H. Edlow
*Attorney, Agent, or Firm*—Craig & Antonelli

[57] ABSTRACT

In a method for making a light emitting device having hemispherical dome type geometry, a p-conductivity type and then an n-conductivity type layer are successively grown epitaxially on a substrate made of a mixed compound semiconductor crystal having a band gap wider than the two above-mentioned layers. A surface portion of these epitaxially grown layers, which is not covered by a mask deposited on the n-conductivity type layer at a position where a p-n junction is to be formed, is doped with p-conductivity type impurities so that a small n-conductivity type region is surrounded by a region converted into p-conductivity type. The other side of the crystal is formed into a hemispherical shape so that the n-conductivity type region is located at the central portion of the hemisphere.

8 Claims, 7 Drawing Figures

LIGHT EMITTING SEMICONDUCTOR DEVICE AND A METHOD FOR MAKING THE SAME

BACKGROUND OF THE INVENTION

1. Field of the Invention

The present invention relates to a light emitting semiconductor device, more particularly, to a high output light emitting semiconductor device made of a III–V mixed compound semiconductor crystal having a p-n junction, and to a method for making the same.

2. Description of the Prior Art

Various types of light emitting semiconductor devices are already known. They are often made of a III–V mixed compound semiconductor crystal, such as $GaAs_{1-x}P_x$ and $Ga_{1-x}Al_xAs$, having a dome or hemispherical shape so that light generated at a p-n junction, which is formed mostly at the center of the planar surface of the hemisphere, can be emitted outside the crystal without total reflection at the surface of the crystal. In one of these hemispherical dome type geometry devices, the major part of the crystal is of n-conductivity type, and a p-conductivity type region is formed by diffusion at the central portion of the hemispherical crystal. One electrode is formed on the planar surface of the p-conductivity type region and another electrode, in a circular band shape, is also formed on the planar surface of the n-conductivity type region near the circular edge of this surface. The band gap is narrowest at the planar surface and becomes wider as the distance from this surface increases. This distribution of band gap width is most easily obtained by using segregation during crystal growth. Owing to this distribution of band gap width, light generated at the p-n junction formed between the *p* and *n* conductivity type regions is hardly absorbed in the crystal and is externally emitted with high efficiency.

In another type of device, a p-conductivity type layer is epitaxially grown on the surface of an *n* conductivity type III–V mixed compound semiconductor substrate which has a narrower band gap than the surface of opposite side. A circular portion including a part of this layer, which is slightly thicker than the *p* conductivity type layer, is removed by mesa-etching so that a p-n junction is delimited by this mesa-etching. The crystal is shaped in a dome or hemisphere, and two electrodes are formed on the *n*- and *p*-conductivity type layers as described for the type where the surface on which electrodes are provided is planar, and the p conductivity type region is formed by diffusion.

The first type of light emitting device, where the p-conductivity type region formed by selectively diffusing impurities is used directly as one of the two regions forming a p-n junction, has the disadvantage that carrier mobility is small and light emission efficiency is low due to the coexistenance of donars, such as Te, and acceptors, such as Zn, in the p-conductivity type region.

The second type of light emitting device, where the p-n junction is formed by epitaxial growth and delimited by mesa-etching, has the drawback that the diode must be mounted face-down on an auxiliary mounting device having two surfaces, the difference in height of which is equal to the height of the mesa, in order to connect the positive and negative electrodes to their respective external leads.

This complicates the process and lowers the yield rate of fabrication. Furthermore, this type of mounting increases both the thermal and electrical resistances. For this type of light emitting device, the electrical contact resistance at the positive and negative electrodes and the series resistance component of the p-conductivity type $Ga_{1-x}Al_xAs$ layer cannot be significantly reduced, because the majority carrier concentration in the p-conductivity type layer and that in the n conductivity type layer are preferably $1 - 2 \times 10^{18}$ cm$^{-3}$, taking the injection efficiency and crystallographical structure into account. Since the external quantum efficiency of these high output power light emitting devices is ordinarily from 5 to 15%, high thermal and electrical resistances are serious drawbacks of this type of light emitting device.

BRIEF DESCRIPTION OF THE INVENTION

An object of this invention is, therefore, to provide a high power limit emitting device, the feasibility of which is high and at the same time the assembly of which is easy.

Another object of this invention is to provide a new method for making such a high power light emitting device.

According to the invention, a p-conductivity type and then an n conductivity type layer are successively grown epitaxially on a substrate made of a mixed compound semiconductor crystal having a wider band gap than the two above-mentioned layers. A surface portion of the epitaxially grown layers which is not covered by a mask deposited on the n conductivity type layer, at a position where a p-n junction is to be formed, is doped with p-conductivity type impurities so that a small n-conductivity type region is surrounded by a region converted into p-conductivity type. The other side of the crystal is formed into a hemispherical shape, so that the n-conductivity type region is located at the central portion of the hemisphere.

According to another more advantageous mode of realization of this invention, a ditch reaching the n conductivity type layer is formed by removing a peripheral portion of the p-n junction by selective etching so as to isolate the p-n junction by air.

The invention will be better understood from the following detailed description thereof taken in conjunction with the drawing. It should, however, be understood that the present invention is not limited to the particular embodiments shown hereinbelow, but that various changes and modifications can be made without departing from the spirit of the present invention.

DETAILED DESCRIPTION

Embodiment 1

Figure 1:
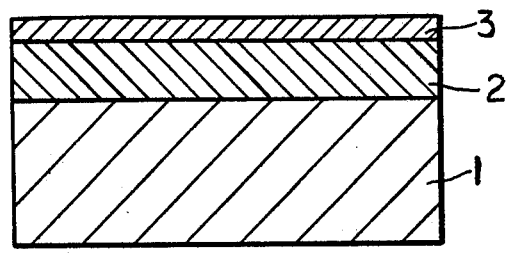
FIGS. 1 to 5 are sectional views illustrating various stages in the fabrication of a high power limit emitting diode according to this invention.
Figure 2:
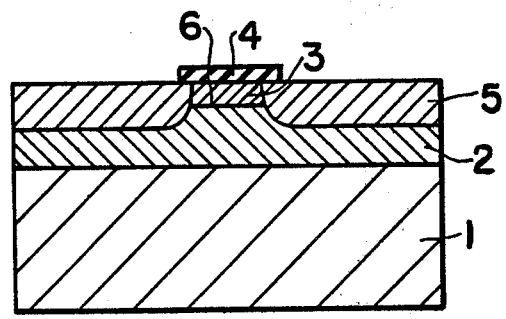

FIGS. 1 to 5 illustrate various stages in the fabrication of a light emitting diode made of $Ga_{1-x}Al_xAs$ according to this invention. A $Ga_{1-x}Al_xAs$ substrate 1 was prepared by liquid phase crystal growth method. The conductivity type of the substrate can be either p or n. The mixing ratio was greater than 0.2 at one surface and increased toward the opposite surface. A p conductivity type $Ga_{1-x}Al_xAs$ $0 \leq x < 0.2$ layer 2, 20 to 30$\mu$ thick, doped with Zn, and an n conductivity type $Ga_{1-x}Al_xAs$ $0 \leq 0 x < 0.2$ layer 3, 2 to 3 $\mu$ thick, doped with Te, were successively grown epitaxially on the surface of the substrate 1, each having a narrower forbidden band gap than the substrate 1. The thickness of the p conductivity type layer is preferably between 20 and 30$\mu$. A layer thinner than 20$\mu$ may contain many crystal defects or stress at the upper surface due to mismatching of the lattice constant, as will be discussed later, and for a layer thicker than 30$\mu$, it is difficult to obtain an appropriate mixing ratio at the upper surface because of the great segregation coefficient of AlAs with respect to GaAs. The thickness of the n conductivity type layer 3 is preferably between 2 and 3$\mu$. The thinner the layer, the better the heat generated at the p-n junction is dissipated. The layer should be, at most, 3$\mu$ thick. However, for a layer thinner than 2$\mu$, the formation of an ohmic contact on it will be difficult. The impurity concentration of p- and n-conductivity type layers was $2 \times 10^{18}$ cm$^{-3}$ and $1 \times 10^{18}$ cm$^{-3}$ respectively. After having well washed and dried the crystal thus obtained, an $Al_2O_3$ layer about 1000 A thick and a phosphosilicate glass layer about 2000 A thick were deposited by chemical vapor deposition method on the n-conductivity type layer 3. A part of this double oxide layer was removed, leaving a circle having a diameter of 150$\mu$ by photoetching method so as to form a mask 4. The crystal was placed in a quartz ampoule and Zn impurities were diffused in the surface at 700° C for 1.5 hours using a diffusion source of $ZnAs_2$. By this process a p$^+$ conductivity type layer 5 having a diffusion depth of about 5$\mu$ was formed and, at the same time, a p-n junction 6 formed between the p-conductivity type layer 2 and the n-conductivity type layer 3 was bounded in a desired shape, as shown in FIG. 2.

Figure 3:
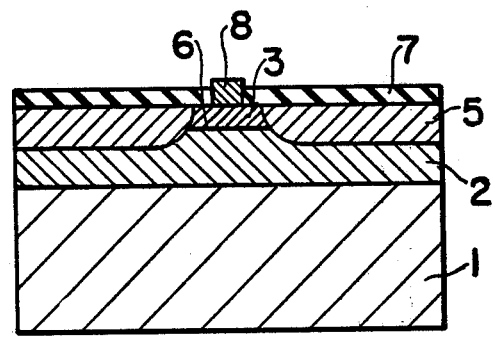
Figure 4:
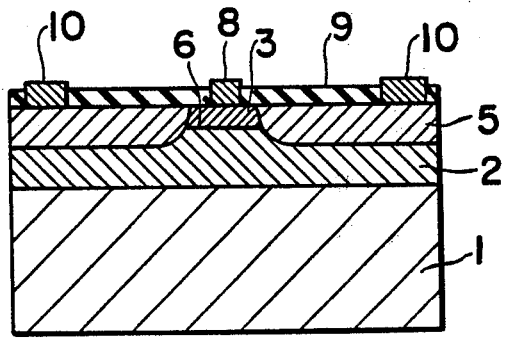

After having etched away the mask 4, a new layer of phosphosilicate glass 7 about 5000 A thick was deposited on the surface of the crystal by chemical vapor deposition. An opening for an electrode for the n-conductivity type layer was provided in this phosphosilicate glass layer 7 by photoetching. An ohmic contact 8 of AuGe-Ni-Au was deposited in this opening by evaporation, as illustrated in FIG. 3. After having removed this phosphosilicate glass layer 7 by etching, a new phosphosilicate glass layer 9 about 5000 A thick was deposited and a circular band shaped opening was formed near the edge of the surface of the crystal by photoetching. Through this opening an ohmic contact 10 of an alloy of AuZn or AnSbZn was formed by evaporation, as shown in FIG. 4. The crystal was formed in a hemispherical dome shape by mechanical and chemical polishing so that the center of the hemisphere was approximately in accordance with the center of the planar surface, as shown in FIG. 5.

Figure 5:
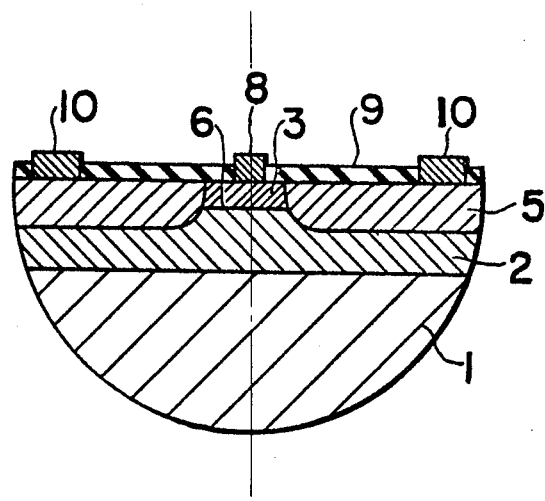
Figure 6:
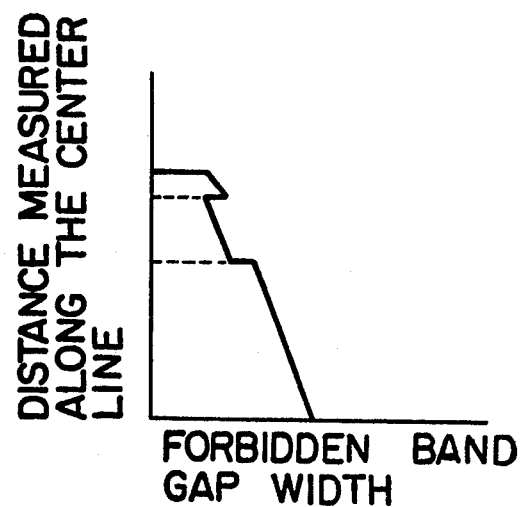
FIG. 6 is a graph of the variation of the forbidden band gap width along the center line of the diode depicted in FIG. 5.

FIG. 6 shows the variation of the forbidden band gap width along the center line of the diode indicated in FIG. 5. The variation of the forbidden band gap width of each layer is easily obtained by using the difference of the segregation coefficient of GaAs and that of AlAs, because the latter solidifies faster and has a wider forbidden band gap than the former.

The light emitting dioe of this structure can overcome the drawbacks of the above-mentioned traditional techniques, namely, difficulty of the control of wavelength of the emitted light and difficulty of assembly, simultaneously. The contact resistance of the ohmic contact formed on the n-conductivity type layer can be reduced by increasing the n-conductivity type impurity concentration at the surface. The contact resistance of the ohmic contact formed on the p$^+$ conductivity type layer is very low, because the impurity concentration at the surface of this layer formed during the process of isolation diffusion is very high. In this way, one can prevent the saturation phenomena in the output power of generated light due to heat production, which is a characteristic of high power light emitting diodes according to prior art techniques.

Furthermore, for light emitting diodes, it is more advantageous to form a p-conductivity type layer at first and then an n-conductivity type layer as indicated above than to form a p-conductivity type layer on an n-conductivity type substrate in accordance with the prior art techniques. The reason for this is believed to be as follows.

In general, the mobility of electrons is greater than that of holes in substances used for injection type light emitting semiconductor diodes, such as GaAs, $Ga_{1-x}Al_xAs$, and other mixed crystal compound semiconductors which have a direct transition type band structure. Consequently, the number of electrons injected into the p-conductivity type region forming a p-n junction is greater than the number of holes injected into the n-conductivity type region. Therefore, light is generated mostly in the p-conductivity type region. Thus, in order to increase the light emission efficiency, it is very important to improve the crystallographical properties of this region. For this purpose, it is advantageous that the p-conductivity type region be very thick so that, near the upper surface of this region, there exist practically no crystal defects due to the difference in lattice constants and so forth, which defects can exist in abundance near an interface between a substrate and a layer epitaxially grown on it. Another reason consists in the fact that carbon is an amphoteric impurity with respect to III-V compound semiconductors. It behaves as n-type impurity in a lower temperature region and as p-type impurity in a higher temperature region. III-V compound semiconductor crystals are often grown in a jig made of graphite and some carbon is inevitably introduced into these crystals during the crystal growth process. In the structure described above, since the p-conductivity type region is placed inside the n-conductivity type region, the temperature is higher in the former than in the latter. Consequently, carbon impurities are not a problem, even if some carbon is contained in the light emitting region.

Several characteristics of diodes thus assembled were measured and it was verified that the light output was about 50 mW (for a direct current of 300 mA), the peak wavelength of the emitted light was 8020A, the thermal resistance was about 20-25 deg/W, and the saturation phenomena of light output were not so evident as for traditional type devices due to the fact that the thermal resistance was reduced. The yield rate for the assembly was also increased to 95%, which was greater by about 25% than the yield rate for traditional devices which is 70%. The I-IV characteristics, which are the most important electric properties, were as good as those of traditional type devices.

Embodiment 2

In Embodiment 1, Zn impurities were diffused into the crystal. In this way, the interface between the n-conductivity type region 3 and the p$^+$-conductivity type region 5 is curved not only due to normal lateral diffusion but also due to extraordinary diffusion between a diffusion mask and a semiconductor body. This may sometimes shorten the life of the diode by strengthening the electric field at the edge of the p-n junction formed between the n-conductivity type layer 3 and the p-conductivity type layer 2. This disadvantage is obviated by using ion implantation techniques.

After having formed the mask 4, Zn$^+$ ions were implanted in the crystal, the temperature of which was maintained between room temperature and 400° C using the mask 4 with a dose between $2.5 \times 10^{15}$ cm$^{-2}$ and $2 \times 10^{16}$ cm$^{-2}$. The mask 4 intercepted the Zn ions and the surface region, which was not covered by the mask 4, was converted into a p$^+$-conductivity type region. The phosphosilicate glass layer on the Al$_2$O$_3$ layer was removed by using an etching solution of HF : NH$_4$F = 1 : 6. After having washed and dried the crystal, an SiO$_2$ layer about 2000 A thick was deposited by chemical vapor deposition on the Al$_2$O$_3$ layer and on the exposed surface of the p$^+$-conductivity type layer. The crystal was then put in a vacuum sealed quartz ampoule and heated for a period of 150 minutes at a temperature of 700° C. By this process the implanted Zn ions were diffused so as to form a p$^+$-conductivity type layer 5 reaching the p-conductivity type layer 2, so that the remaining part of the n-conductivity type layer 3 was completely surrounded by the p$^+$-conductivity type layer 5 and a well-defined p-n junction 6 was formed, as indicated in FIG. 2. A part of the crystal was cleft in order to examine, by using a scanning electron microscope, how the p-n junction was formed, and it was observed that there was no extraordinary diffusion at the interface between the Al$_2$O$_3$ layer and the compound semiconductor crystal and that the p$^+$-conductivity type layer formed by diffusion reached well into the p-conductivity type layer 2.

After the formation of the p$^+$-conductivity type layer the diode was assembled just as in Embodiment 1. The high power light emitting diode thus obtained had mechanical and electrical properties identical to that obtained in Embodiment 1 and a longer life.

Embodiment 3

Figure 7:
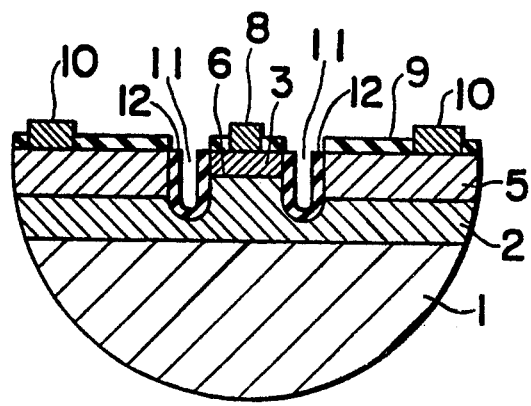
FIG. 7 is a sectional view of another high power light emitting diode according to the invention.

The diode obtained in Embodiment 1 an be improved by mesa-etching for isolating the n-conductivity type layer 3 by air. A circular band-shaped opening was formed in the phosphosilicate layer 7 so as to expose a narrow region of the surface of the crystal, which comprised the circular boundary between the n-conductivity type layer 3 and the p$^+$-conductivity type layer 5. The crystal was dipped in an etching solution (temperature 18° ± 0.2° C) having a composition of ethylene glycol : hydrogen peroxide : sulfuric acid = 7 : 2 : 1 for a period of about 10 minutes under agitation. In this way a ditch 11 about 5µ deep was obtained. Since the n conductivity type layer 3 was thinner than 3µ, it is evident that a part of the p-n junction was etched away. Another phosphosilicate layer 12 about 6000 A thick was deposited on the crystal in order to passivate the surface, which layer was removed except for the region in the ditch by photoetching method. The crystal was formed into a hemispherical dome by mechanical and chemical polishing, as shown in FIG. 7, and as described in Embodiment 1.

In the above Embodiments, liquid phase epitaxial growth of Ga$_{1-x}$Al$_x$As on a Ga$_{1-x}$Al$_x$As substrate is described. However, it is evident that the method described above can be applied to other combinations such as GaP-Ga$_{1-x}$In$_x$P (0.3 < $x$ < 1), GaP-GaAs$_{1-x}$P$_x$(0 < $x$ < 0.4), etc.

We claim:

1. A high power light emitting semiconductor device comprising:
    a semiconductor body which has first and second surfaces and which contains
        a first semiconductor region having a third surface, the forbidden band gap width of said first semiconductor region increasing from said third surface into said first region,
        a second semiconductor region of a first conductivity type, disposed on said third surface of said first semiconductor region, and having a forbidden band gap width which is narrower than the width of the forbidden gap of said first region at said third surface thereof,
        a third semiconductor region of a second conductivity type, opposite said first conductivity type, disposed on a prescribed surface portion of said second semiconductor region and defining a first PN junction with said prescribed surface portion of said second semiconductor region, the width of the forbidden band gap of said third semiconductor region being narrower than the width of the forbidden gap of said first semiconductor region at said third surface, and
        a fourth semiconductor region, of said first conductivity type and having an impurity concentration greater than that of said second semiconductor region, disposed on a portion of the surface of said second semiconductor region, which portion of the surface of said second semiconductor region surrounds said prescribed surface portion of said second semiconductor region, the width of the forbidden band gap of said fourth semiconductor region being narrower than the width of the forbidden gap of said first semiconductor region at said third surface;
    a first electrode disposed on the surface of said third semiconductor region; and
    a ring-shaped second electrode disposed on the surface of said fourth semiconductor region so as to surround said first electrode; and wherein
    the surfaces of said third and fourth semiconductor regions upon which said first and second respective electrodes are disposed form the first surface of said semiconductor body, while the second surface of said semiconductor body, which extends to the first surface thereof, is hemispherically shaped.

2. A high power light emitting semiconductor device according to claim 1, wherein said first conductivity type is p-type and said second conductivity type is n-type.

3. A high power light emitting semiconductor device according to claim 1, further comprising a ring-shaped ditch separating said third semiconductor region from said fourth semiconductor region.

4. A high power light emitting semiconductor device according to claim 3, wherein said ditch extends partially into said second semiconductor region and is contiguous with both said prescribed surface portion thereof and the surface portion of said second semiconductor region surrounding said prescribed surface portion.

5. A high power light emitting semiconductor device according to claim 1, wherein said fourth semiconductor region is contiguous with said third semiconductor region and defines a second PN junction therewith.

6. A high power light emitting semiconductor device according to claim 5, wherein the maximum distance from said first surface of said semiconductor body to the interface between said second and fourth semiconductor regions is greater than the distance from said first surface of said semiconductor body to said first PN junction.

7. A high power light emitting semiconductor device according to claim 4, wherein the distance from said first surface of said semiconductor body to the interface between said second and fourth semiconductor regions is greater than the distance from said first surface of said semiconductor body to said first PN junction.

8. A high power light emitting semiconductor device according to claim 2, wherein the thickness of said second semiconductor region is 20–30 $\mu$ and the thickness of said third semiconductor region is 2–3 $\mu$.

* * * * *